(12) United States Patent
Kaner

(10) Patent No.: US 11,239,381 B2
(45) Date of Patent: Feb. 1, 2022

(54) PHOTODIODE STRUCTURED PHOTOSENSITIVE IMAGING SURFACES, METHODS AND APPARATUS

(71) Applicant: Hewlett-Packard Development Company, L.P., Spring, TX (US)

(72) Inventor: Roy Kaner, Ness Ziona (IL)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/051,101

(22) PCT Filed: Aug. 13, 2018

(86) PCT No.: PCT/US2018/046516
§ 371 (c)(1),
(2) Date: Oct. 27, 2020

(87) PCT Pub. No.: WO2020/036580
PCT Pub. Date: Feb. 20, 2020

(65) Prior Publication Data
US 2021/0232057 A1    Jul. 29, 2021

(51) Int. Cl.
*H01L 29/06*    (2006.01)
*H01L 31/105*   (2006.01)
*G03G 15/00*    (2006.01)

(52) U.S. Cl.
CPC ........... *H01L 31/105* (2013.01); *G03G 15/75* (2013.01)

(58) Field of Classification Search
CPC .............................. G03G 15/75; H01L 31/105
USPC ...................................... 250/578.1
See application file for complete search history.

(56) References Cited

U.S. PATENT DOCUMENTS

| | | | |
|---|---|---|---|
| 4,616,247 A * | 10/1986 | Chang et al. | H01L 31/105 257/438 |
| 4,728,803 A | 3/1988 | Catchpole | |
| 4,739,414 A * | 4/1988 | Pryor et al. | H04N 1/0311 358/482 |
| 5,471,283 A | 11/1995 | Irihara et al. | |
| 6,600,473 B1 | 7/2003 | Kobayashi et al. | |
| 7,400,661 B2 | 7/2008 | Cannon et al. | |
| 7,643,525 B2 | 1/2010 | Heink et al. | |
| 7,732,886 B2 * | 6/2010 | Shih et al. | H01L 31/105 257/458 |
| 7,760,392 B2 | 7/2010 | Heink et al. | |
| 9,484,537 B2 | 11/2016 | Liang et al. | |
| 9,964,891 B2 | 5/2018 | Anderson et al. | |

FOREIGN PATENT DOCUMENTS

| | | |
|---|---|---|
| DE | 102007035993 A1 | 2/2009 |
| WO | WO-2014079506 A1 | 5/2014 |
| WO | WO-2018143949 A1 | 8/2018 |

\* cited by examiner

*Primary Examiner* — William J Royer
(74) *Attorney, Agent, or Firm* — Dierker & Kavanaugh PC

(57) ABSTRACT

In an example, a photosensitive imaging surface is provided by an extended photodiode structure.

14 Claims, 5 Drawing Sheets

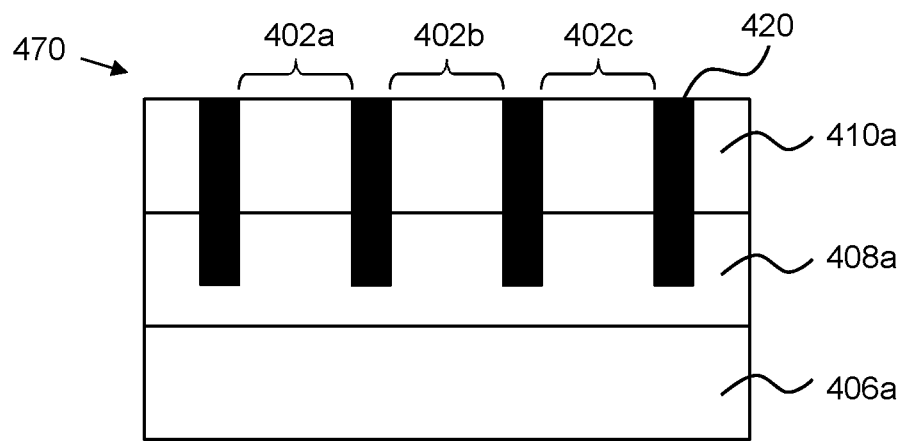

Fig. 4D

```
┌─────────────────────────────────────────────────┐
│  Charge surface with charges originating within a │──── 502
│  photodiode structure by applying electric field  │
└─────────────────────────────────────────────────┘
                        │
┌─────────────────────────────────────────────────┐
│  Form charge pattern on surface by selectively   │──── 504
│           irradiating the surface                │
└─────────────────────────────────────────────────┘
```

Fig. 5

PHOTODIODE STRUCTURED PHOTOSENSITIVE IMAGING SURFACES, METHODS AND APPARATUS

BACKGROUND

Printers, such as Liquid Electrophotographic (LEP) printers and the like, may print an image by forming a latent electrostatic charge pattern on a surface, applying charged print agent to the surface and transferring the applied print agent to a print media. Due to the latent electrostatic charge pattern on the surface, when the print agent is applied to the surface it forms an image corresponding to the charge pattern on the surface. The latent electrostatic charge pattern may be formed by charging a photosensitive imaging surface, and selectively discharging the photosensitive imaging surface by selectively irradiating the surface.

BRIEF DESCRIPTION OF DRAWINGS

Non-limiting examples will now be described with reference to the accompanying drawings, in which:

FIG. 4A, FIG. 4B, FIG. 4C and FIG. 4D show examples of photosensitive imaging surfaces;

FIG. 5 is a flowchart of an example method of operating a printing device;

DETAILED DESCRIPTION

Figure 1:
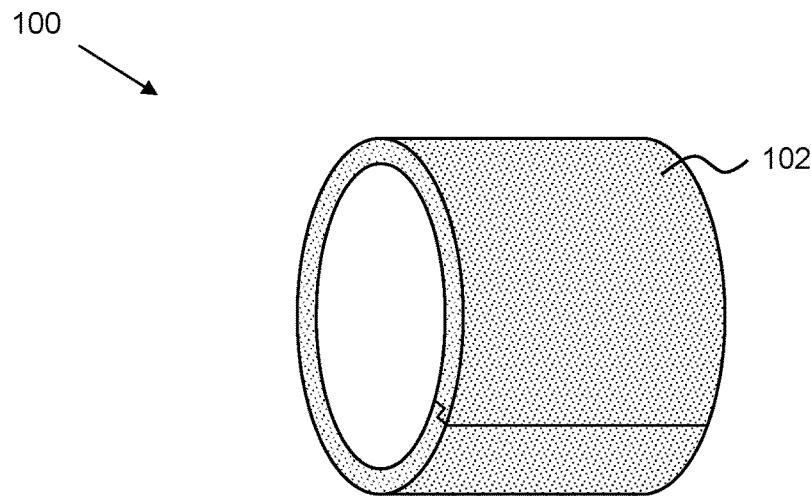
FIG. 1 is an example of a photosensitive imaging surface.

In some examples of printing techniques, charged print agents, such as charged toner particles or resins, may be applied to a surface, in some examples, a charged photosensitive imaging surface. Such print agents may be subsequently transferred (in some examples via at least one intermediate transfer member) to a substrate.

For example, a print apparatus may comprise an electrophotographic print apparatus such as a Liquid Electro Photographic (LEP) print apparatus which may be used to print a print agent such as an electrostatic printing fluid or composition (which may be more generally referred to as "an electronic ink" in some examples). Such a printing fluid may comprise electrostatically charged or chargeable particles (for example, resin or toner particles which may be colored particles) dispersed in a carrier fluid. In some such apparatus, a substantially uniform static charge may be provided on a photosensitive imaging surface (which may be termed a photo imaging plate, or 'PIP'), which may be a curved surface, for example a cylindrical surface, around a drum or a roller, or the photosensitive imaging surface may be arranged on a belt, such as an endless belt, which in use may be arranged on two or more rollers. In other examples, the photosensitive imaging surface may have any form, and may be flat. A write head, which may for example comprise at least one laser, may be used to dissipate the static charge in selected locations of the image area on the photosensitive imaging surface to leave a latent electrostatic image, representing a pattern to be printed.

An electrostatic printing fluid composition (generally referred to herein as 'print agent') is transferred to the imaging surface from a print agent source using a print agent supply unit (which may be termed a Binary Ink Developer (BID) unit in some examples), which may present a substantially uniform film of the print agent to the imaging surface for example via a print agent application roller.

In an example, a resin component of the print agent may be electrically charged by virtue of an appropriate potential applied to the print agent in the print agent source. The charged resin component, by virtue of an appropriate potential on the electrostatic image areas of the imaging surface, is attracted to a latent electrostatic image on the imaging surface. In one example, the print agent does not adhere to the charged areas and forms an image in print agent on the imaging surface in the uncharged locations. The imaging surface will thereby acquire a 'developed' print agent electrostatic ink composition pattern on its surface.

In some examples, the pattern may then be transferred to an Intermediate Transfer Member (ITM), by virtue of pressure and/or an appropriate potential applied between the imaging surface and the ITM such that the charged print agent is attracted to the ITM. The ITM may for example comprise a loop, which may be a 'blanket' comprising a rubber layer, for example arranged about rollers or provided on the surface of a drum, a cylinder, a roller, an endless belt, or the like. The ITM may be urged towards the imaging surface to be in close proximity or in contact therewith.

As such, a photosensitive imaging surface may be used in printers, such as Liquid Electrophotographic (LEP) printers, but also in other types of printer, copiers, and other imaging devices.

Photosensitive imaging surfaces may comprise a photoconductive layer. A photoconductive material is one which becomes more electrically conductive when irradiated with electromagnetic radiation. Such photoconductive photosensitive imaging surfaces may be charged by ionizing the air surrounding the photoconductive material or by direct contact, for example using a corona discharge device, a scorotron or a charge roller. However this ionization process can create free radicals, such as ozone, which shorten the photoconductor lifespan. Furthermore ozone is environmentally unfriendly and hazardous, and in some cases a catalytic converter may be provided in printers comprising such a photosensitive imaging surface. Additionally this charging process can result in variance of charging along the photoconductive area due to spatial instability. The process also utilises high voltages (for example, in the order of several hundred volts). Image writing to the photoconductor is performed by discharging the photoconductor by exposing it to radiation, however, due to the properties of some photoconductors, during image writing there may be an incomplete discharge of the charged photoconductor.

FIG. 1 shows a photosensitive imaging surface 100 provided by an extended photodiode structure 102. In this example, "extended" means the structure's lateral dimensions are significantly greater than the structure's thickness. For example the thickness of the structure may be tens of microns, or perhaps a few millimetres. The length and width of the surface 100 may be, for example centimetres or tens of centimetres. In one example, the length and width of the surface 100 are comparable in size or larger than the media to be printed on, and as such may be tens of centimetres up to several meters. For example the length and width may be 100 cm and 70 cm respectively. A photodiode structure may comprise layers, and as used herein the thickness of the structure refers to the dimension in the direction perpendicular to the layers. Alternatively the thickness may be defined as the dimension in the direction in which the electrical properties are altered by irradiation, as described below.

A photodiode is a semiconductor device with properties which change when illuminated with radiation. When uni-illuminated by radiation to which it is sensitive, the photodiode has an asymmetric conductance and conducts primarily in one current direction. The photodiode has a low resistance to currents in one direction and a high resistance to currents in the opposing direction. When illuminated with radiation of an appropriate wavelength for that photodiode type, the resistance is low in both directions.

As described above, some photosensitive imaging surfaces comprise a photoconductor structure. When in darkness (or more particularly, when not exposed to a radiation to which it is sensitive), the conductivity of a photoconductor is low to currents in both directions. However, when a photodiode is in 'darkness' in the same sense, the conductivity of the device is low to currents in one direction and high to currents in the opposing direction. Therefore a photodiode structure may be charged by application of an appropriate electric field, which causes charge carries to move within the device in the direction with low resistance. Charge then accumulates at the surface of the device. In comparison, a photoconductor is charged with charges sourced from outside the device, as described above.

In the example of FIG. 1, the photosensitive imaging surface 100 having an extended photodiode structure 102 is provided around a drum, i.e. the surface is curved. This configuration is convenient for continuous printing operations although in other examples, the photosensitive imaging surface 100 may for example be planar, or formed into some other shape, for example on an endless belt or roller. In some examples, there may be more than one extended photodiode structure 102, which may make up one or a plurality of photosensitive imaging surfaces 100. An overlap may be formed in the region of the seam to provide a continuous surface.

The photodiode structure 102 may be formed by one or more photodiodes. For example, a plurality of photodiodes may be arranged, formed and/or mounted on a common backplane to provide a photodiode structure 102.

Figure 2A:
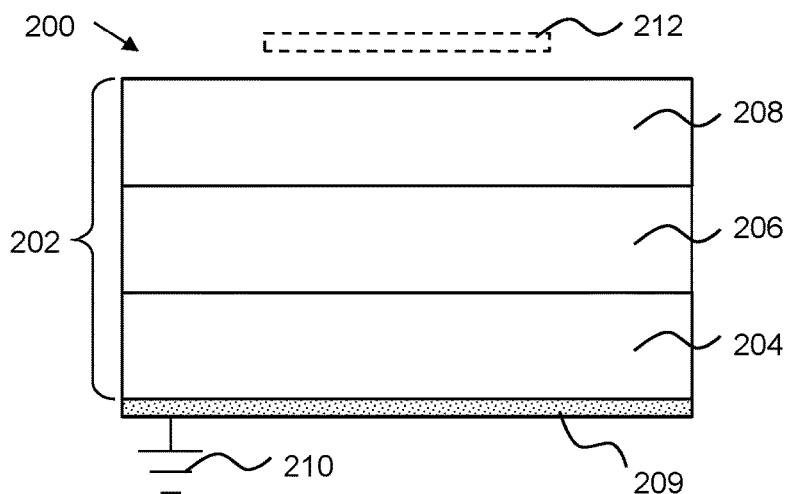
FIG. 2A is another example of a photosensitive imaging surface.

FIG. 2A shows a photosensitive imaging surface 200 having a photodiode structure 202, wherein the photodiode structure 202 comprises one or a plurality of photodiodes. At least one photodiode of the photodiode structure 202 in this example comprises a first layer 204 comprising n-type doped semiconductor material, a second layer 206 comprising an intrinsic semiconductor material and a third layer 208 comprising p-type doped semiconductor material.

The semiconductor material may be, for example silicon. Silicon may be doped with n-type dopants, such as phosphorus, arsenic, antimony, bismuth or lithium to provide an n-type doped semiconductor material layer, and may be doped with p-type dopants such as boron, aluminium, gallium or indium to provide a p-type doped semiconductor material layer. An intrinsic semiconductor is one with no net doping, and may be un-doped, or comprise substantially equal quantities of p-type and n-type dopants.

As depicted in FIG. 2A, the second layer 206 is on top of the first layer 204, and the third layer 208 is on top of the second layer 206. This results in a structure with an intrinsic semiconductor layer formed on an n-type semiconductor layer, and a p-type semiconductor layer formed on the intrinsic layer. Such a structure is known as a PIN junction and functions as a photodiode. Although not shown in this figure, the photodiode structure in this example extends significantly further in the direction parallel to the layers, than in the direction perpendicular to the layers, to provide the extended structure.

The extended photodiode structure 202 is arranged on a grounded conductive layer 209. The grounded conductive layer 209 may be formed from a metal, for example aluminium although other conductive materials may be used.

In an example, a photosensitive imaging surface 200 may be used in a print apparatus. In such an example, in use, the photosensitive imaging surface 200 may be charged by applying an electric field across the photodiode structure 202. The conductive layer 209 is connected to ground 210. A charging element, shown in this example as a conductive plate 212, (which is part of the print apparatus rather than the photosensitive imaging surface 200, and is therefore shown in dotted outline) is provided above the photosensitive imaging surface 200.

To charge the photosensitive imaging surface 200, a potential may be applied to the conductive plate 212, in this example a positive potential relative to the grounded conductive layer 209. In some examples, the positive potential applied to the conductive plate 212 may be switchable, and the voltage controllable, to control charging of the photosensitive imaging surface 200. In some examples, the conductive plate 212 may be movable relative to the photosensitive imaging surface 200. In one example, the conductive plate 212 may be substantially static while the photosensitive imaging surface 200 moves past the conductive plate 212 while a potential is applied to the conductive plate 212. The photosensitive imaging surface 200 may thereby be charged as it moves. In some examples, the conductive plate 212 may be scanned across the photosensitive imaging surface 200. Providing for relative movement allows the conductive plate 212 to be smaller than the photosensitive imaging surface 200, while retaining the ability to charge the whole photosensitive imaging surface 200. In other examples, they may be of similar dimensions. In some examples, a separation between the photosensitive imaging surface 200 and the conductive plate 212 (or more generally the charging element) may be adjustable and/or may be minimised. In some examples, (for example where an insulating layer is provided on the photosensitive imaging surface 200), a charging element may be in contact with the photosensitive imaging surface 200.

Figure 2B:
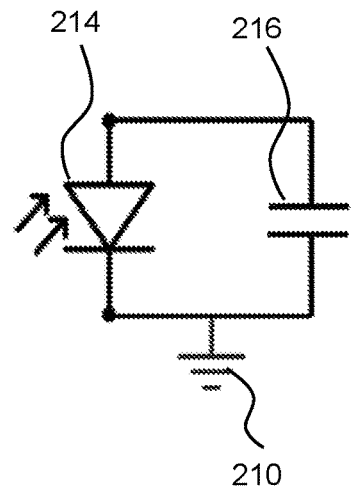
FIG. 2B is a circuit diagram of an example circuit equivalent to a photosensitive imaging surface.

FIG. 2B shows a circuit diagram of a circuit equivalent to the photosensitive imaging surface 200 and conductive plate 212 shown in FIG. 2B. The photodiode 214 represents the photodiode structure 202 and a capacitor 216 represents the capacitance between the conductive layer 209 and the conductive plate 212.

Figure 3:
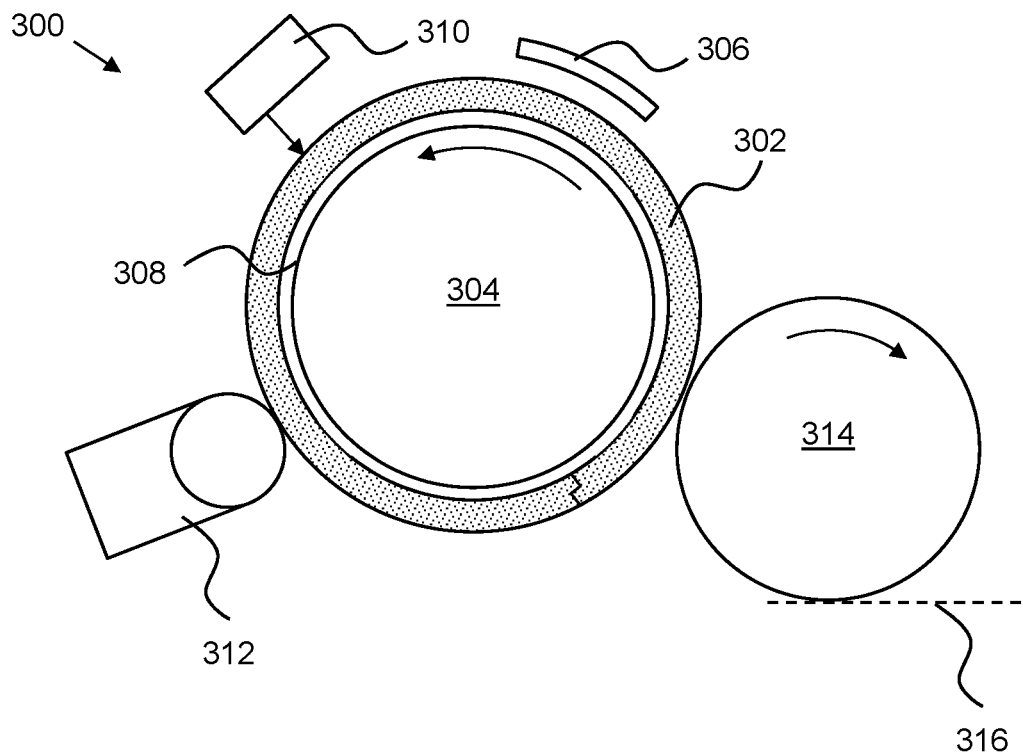
FIG. 3 is an example of a printing apparatus.

FIG. 3 shows a printing apparatus 300 comprising a photosensitive imaging surface 302 provided by an extended photodiode structure, a charging element 306 to apply an electric field to cause the movement of charge towards a face of the photosensitive imaging surface 302 and a write head 310, to selectively discharge a portion of the photosensitive imaging surface 302. In this example, the photosensitive imaging surface 302 is formed on at least part of a cylindrical surface, although in other examples it may have some other form, for example being planar, or being provided on an endless belt, a drum, or a roller. In this example the cylindrical surface is a surface of a rotatable drum 304. During an image forming process, a portion of the photosensitive imaging surface 302 rotates and is charged as it passes a charging element, in this example, the charging element 306 is a non-ionizing charging element, specifically a conductive plate 306, to which a potential is applied. This results in an electric field being applied to the photosensitive imaging surface 302, which in turn causes the movement of charge towards a face of the photosensitive imaging surface 302. The photosensitive imaging surface 302 may comprise any of the photodiode structures, or the features thereof, described herein.

In this example, the extended photodiode structure of the photosensitive imaging surface 302 is provided on a grounded conductive metal layer 308. For example, the extended photodiode structure of the photosensitive imaging surface 302 may be formed on a metal layer, or a surface of the drum 304 may be provided with a grounded conductive metal layer. While in this example, the whole of the photosensitive imaging surface 302 is provided with an underlying grounded conductive metal layer 308, this may not be the case in all examples, and the grounded conductive metal layer 308 may be smaller than the photosensitive imaging surface 302. The arrangement may be such that, at least during charging of the extended photodiode structure of the photosensitive imaging surface 302, a portion of the photosensitive imaging surface 302 is arranged between the charging element 306 and a grounded metal layer to form a grounded plate capacitor. In some examples the applied potential is several hundred volts. The charged portion of the photosensitive imaging surface 302 in this example then moves past the write head 310, which selectively discharges the portion of the photosensitive imaging surface 302. In some examples the write head 310 comprises at least one laser, which is scanned across the photosensitive imaging surface 302, irradiating the surface and discharging it as described above. However, in other examples, other write heads may be used. In use of the apparatus, a latent electrostatic image is formed on the photosensitive imaging surface 302 by the write head 310, and the remaining charge defines an image to be printed.

The portion of the photosensitive imaging surface 302 comprising the latent electrostatic image rotates to a print agent source 312. The print agent source 312 presents a substantially uniform film of print agent to the photosensitive imaging surface 302. A component of the print agent is electrically charged and causes the print agent to be attracted to the uncharged portions and repelled from the charged portions of the latent electrostatic image on the photosensitive imaging surface 302, thereby forming a print agent image on the photosensitive imaging surface 302, in the pattern defined by the latent electrostatic image.

In this example the photosensitive imaging surface 302 rotates further, to transfer the print agent image to an Intermediate Transfer Member (ITM) 314. The print agent is transferred by virtue of pressure and/or an appropriate potential applied between the photosensitive imaging surface 302 and the ITM 314, so that the print agent is attracted to the ITM 314. The ITM 314 rotates with the print agent image on its surface. The print agent image is then transferred to print media 316 (shown in dotted outline as it does not comprise part of the printing apparatus 300). In another example, the image may be applied directly from an imaging surface to a media. In some examples, a plurality of layers of print agent may be built up on an ITM 314 and/or on print media 316.

In some examples, the charging element 306 may be as close as is practical to the photosensitive imaging surface 302. In some examples, the photosensitive imaging surface 302 may comprise an insulating outer coating, in which case the charging element 306 may be in contact with the photosensitive imaging surface 302. In general, the size of the charging element 306 and the separation may be determined based on an intended charge transfer effect (and may therefore depend on the choice of material in the photosensitive imaging surface 302, the thickness of the photosensitive imaging surface 302 and the like). In some examples, the charging element 306 may comprise a corona charging device, a charging roller, a scorotron, or the like. The charging element 306 may be moveably mounted such that the separation may be variable and/or configurable.

Figure 4A:
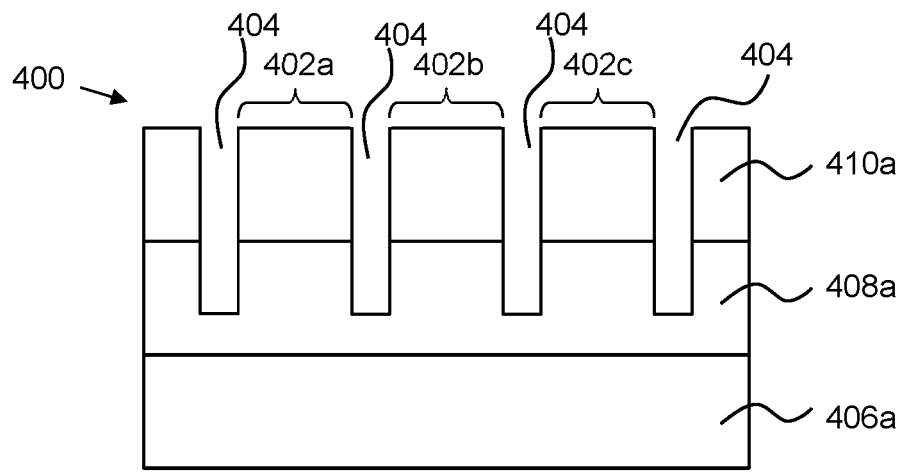

FIG. 4A shows a photosensitive imaging surface 400, in which a layer of the photosensitive imaging surface 400 is divided into pixels 402a, 402b, 402c by barriers 404 which act to block at least one of optical radiation transmission and charge transfer therethrough. In this example, the photosensitive imaging surface 400 comprise a first layer 406a, a second layer 408a which is arranged on top of the first layer 406a and a third layer 410a arranged on top of the second layer 408a. The layers may for example be as described in relation to FIG. 2A above.

The barriers 404 are trenches in the photosensitive imaging surface 400, formed completely through the third layer 410a, and partially through the second layer 408a. However in practice, the trenches may be formed through just a single layer of the photosensitive imaging surface 400, for example the third layer 410a, or may be formed completely through two layers of the photosensitive imaging surface 400, for example the third layer 410a and the second layer 408a. Alternatively the trenches may be formed through three layers of the photosensitive imaging surface 400, for example the first layer 406a, the second layer 408a and the third layer 410a, in effect defining separate photodiodes. Where photosensitive imaging surface 400 comprises additional layers such as grounded conductive layer 209, the trenches may also extend through these layers. The trenches may extend entirely through the photosensitive imaging surface 400. Although a cross section is depicted in FIG. 4A, the trenches may also extend in a second direction to define a two dimensional array of pixels, or a pixel grid.

The trenches may be formed by any suitable semiconductor processing methods, for example masked dry plasma etch, masked wet etch, laser ablation or any other suitable means. The trenches may remain open (i.e. becoming air filled) or may be filled with a suitable dielectric or insulating material. Alternatively the layers may be formed or deposited with spaces between the pixels to form the trenches, rather than depositing continuous layers, and removing material to form the trenches. In some examples, each pixel may be formed separately, for example 'grown' from a separate seed. Other types of barriers 404 may be provided, for example regions of high resistance or low electron mobility may be provided between pixels, for example by selectively implanting dopants to define the pixels 402a, 402b, 402c.

The barriers 404 define pixels 402a, 402b, 402c which may in some examples correspond to pixels of an image to be printed, or a plurality of pixels 402a, 402b, 402c defined by the barriers 404 may correspond to a single pixel to be printed. When each pixel 402a, 402b, 402c is irradiated, the portion of the photosensitive imaging surface 400 corresponding to that pixel 402a, 402b, 402c is discharged.

The barriers 404 may, in some examples, prevent lateral movement of charge within the photosensitive imaging surface 400, preventing charges from a charged pixel migrating to a neighbouring discharged pixel, thereby improving imaging quality. This may reduce 'blooming' in an intended discharged region.

The barriers may, in some examples, provide optical isolation of each pixel 402a, 402b, 402c, reducing discharge of pixels adjacent to the intended pixels 402a, 402b, 402c to be discharged by blocking transfer of light, for example laser light. In some examples, this may reduce, for example, the effects of diffraction which may occur as light may be transmitted via a cleaning fluid (which may in some examples comprise an 'imaging oil', which may be a fluid which is also used as a carrier fluid in an electronic ink), and/or on penetrating the photosensitive imaging surface 400 itself.

Figure 4B:
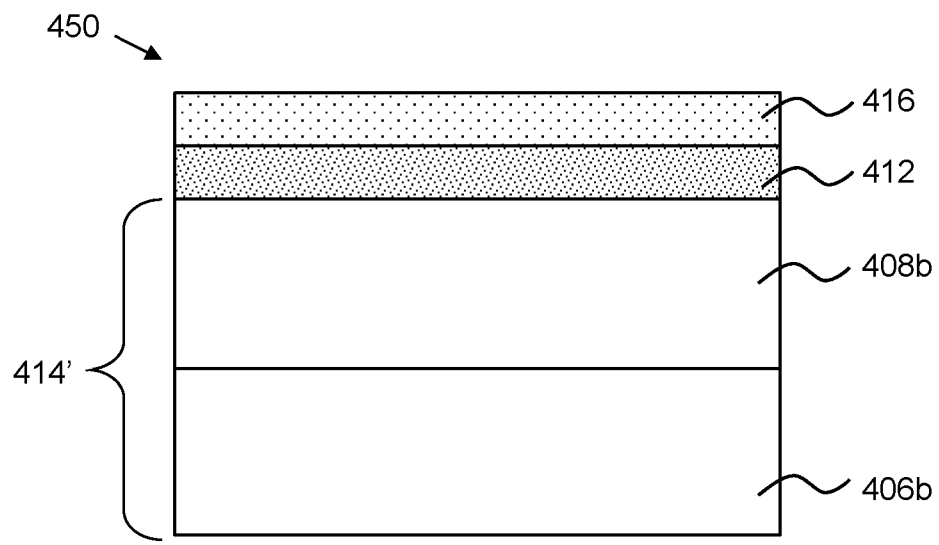

FIG. 4B shows a photosensitive imaging surface 450 comprising a layer, which in this example is a low electron mobility layer 412, on top of a photodiode structure 414'. This example photodiode structure 414' comprises a first layer 406b and a second layer 408b arranged on top of the first layer 406b. The first layer 406b is a p-type semiconductor and the second layer 408b is a n-type semiconductor, and they form a PN junction, which is a different structure to that of FIG. 4A, which also acts a photodiode, as described in more detail below.

In some examples the low electron mobility layer 412 is a highly doped n-type layer. Such a layer reduces lateral movement of charge carriers, improving image quality as described above in relation to trenches. Such a low electron mobility layer may be used as an alternative to, or in addition to, dividing the photosensitive imaging surface 400 in to pixels using barriers 404. In some examples, the layer 412 is a photoconductive layer.

By way of reference, electron mobility of un-doped crystalline silicon, at room temperature (300K) is 1400 $cm^2/(Vs)$. A material with low electron mobility, has an electron mobility significantly lower than this value, for example having an electron mobility of less than 500 $cm^2/(Vs)$, or less than 200 $cm^2/(Vs)$. For example, polycrystalline silicon has an electron mobility of ~100 $cm^2/(Vs)$ and amorphous silicon has an electron mobility of ~1 $cm^2/(Vs)$ at room temperature, and therefore these materials provide examples of materials with low electron mobility. A low electron mobility layer, arranged on top of the photodiode structure 414' reduces lateral movement of charges at the surface. Therefore when a latent electrostatic image is formed, a boundary between charged and discharged regions will be maintained for longer than a similar device without the low electron mobility layer 412.

The photosensitive imaging surface 450, further comprises a layer 416 with a refractive index lower than the refractive index of photodiode structure 414', on top of the photodiode structure 414'. Although shown on top of the low electron mobility layer 412, the layer 416 with refractive index lower than the refractive index of photodiode structure 414' may be formed on a photosensitive imaging surface 450 without a low electron mobility layer 412, such as the photosensitive imaging surface 450 depicted in FIG. 2A or FIG. 4A, or with some other photodiode structure.

The layer 416 with a refractive index lower than the refractive index of the photodiode structure 414' may have a refractive index similar to that of a cleaning fluid to be intended to be used with the photosensitive imaging surface 450, and/or for example any fluid which may be present on the photosensitive imaging surface 450, for example as a film or layer, during the formation of the latent electrostatic image. This reduces defects in the image caused by changes in refractive index at the boundary between such a fluid and the photosensitive imaging surface 450. When discharging the photosensitive imaging surface 450 a precisely controlled light source such as a laser, or a plurality of lasers, selectively illuminates the photosensitive imaging surface 450. If there is a sharp change in refractive index, refraction of the light will reduce the accuracy with which an image can be formed. Therefore matching the refractive index of the photosensitive imaging surface 450 to the refractive index of the printing agent may improve the image formed by a printing apparatus using such a photosensitive imaging surface 450. To further reduce such defects, the refractive index may change gradually throughout the layer 416. The refractive index of silicon is ~4, and the refractive index of a cleaning fluid, in this example imaging oil which may provide the fluid component of electronic ink, is ~1.4. Therefore a material such as silicon dioxide may be used to form the layer 416, as it has a refractive index of around 1.40 to 1.55. Therefore the layer 416 with refractive index lower than the refractive index of the photodiode structure 414' may comprise a material with a gradually changing refractive index. For example the refractive index of such a layer 416 may vary from ~1.4 to ~4. The refractive index may be varied throughout the layer 416 by changing a doping concentration in the layer 416.

Figure 4C:
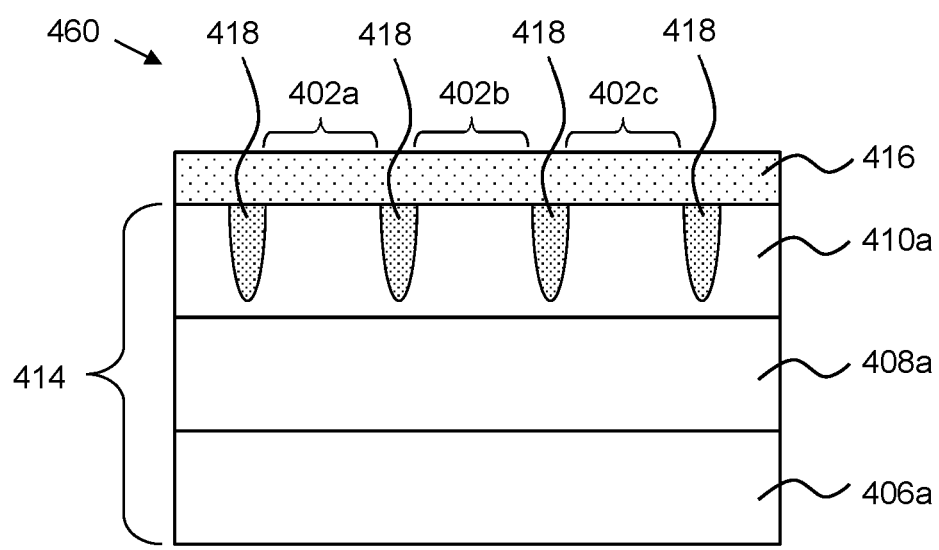

FIG. 4C shows a photosensitive imaging surface 460 comprising doped regions 418. The doped regions 418 may be highly doped, for example highly doped p-type semiconductor, and may be formed by selectively implanting dopants to define the pixels 402a, 402b, 402c. Selective implant may for example be achieved by masking the pixels with a photoresist, implanting a p-type donor and stripping the photoresist. The highly doped regions 418 form regions with low electron mobility, reducing lateral movement of electrons when the surface is charged. In some examples a two dimensional pixel grid may be formed with barriers comprising doped regions 418 in this way.

In this example, the photosensitive imaging surface 460 further comprises a layer 416 with refractive index lower than the refractive index of photodiode structure 414, as has been described above with reference to FIG. 4B.

FIG. 4D shows a photosensitive imaging surface 470 having a structure similar to that shown in FIG. 4A, but instead of trenches, the barriers comprise optical barriers 420. The optical barriers 420 are formed from a material opaque or reflective to the radiation used to selectively discharge the photosensitive imaging surface 470, thus reducing optical defects in the image formed. They may be formed by forming trenches as described in relation to FIG. 4A, then filling the trenches with a suitable material. The material forming the optical barriers 420 may also be an insulator, or dielectric, material to reduce lateral movement of charge, as described above. The depth of the optical barriers 420 may vary from that shown, for example being formed to any depth from partially through the third layer 410a to all the way through the structure.

The photodiode structure depicted in FIG. 2A, FIG. 4A, FIG. 4C and FIG. 4D comprise three layers. However the photodiode structure may be at least one of a PIN junction, a PN (p-type, n-type) junction, a Shottky photodiode structure, which comprises a metal layer on semiconductor layer, and an avalanche photodiode.

As described above, a PIN junction comprises three layers, p-type, intrinsic and n-type, as shown in the Figures. A PN junction is shown in FIG. 2B and comprises two layers, a p-type layer and a n-type layer. A Shottky photodiode comprises a metal layer and a semiconductor layer and an avalanche photodiode comprises, in order, a highly doped n-type layer (n+), a p-type layer, an intrinsic layer and a highly doped p-type layer (p+). In some examples, an insulating layer may be provided on to the photodiode structures.

FIG. 5 is an example of a method, which may be a method of operating a printing apparatus, for example an apparatus as shown in FIG. 3.

Block 502 comprises charging a surface of a photosensitive imaging device with charges originating within a photodiode structure on (or from) which the surface is formed. The surface is charged by applying an electric field to the imaging device. The surface may be an upper surface or may be a surface of a semiconductor (e.g. photodiode) structure within the photosensitive imaging device. The electric field may be applied to the surface by applying a potential to a conductive plate located in the vicinity of the surface. The conductive plate and the surface may be moveable relative to each other, for example the electric field may be applied to the surface by moving the surface past the conductive plate, while a potential is applied to the plate. Prior to charging the surface, the surface may be in an un-charged state, and when the electric field is applied to the surface, electric charges within the photodiode structure move due to the force exerted by the applied electric field. The photodiode structure may be arranged such that when the electric field is applied, there is a low resistance to charge carriers moving in the direction of the force exerted by the applied field and there is a high resistance to charge carriers moving in the opposing direction. This causes charge carriers to collect at the surface, resulting in accumulation of charge at the surface.

The photodiode structure may be any suitable photodiode structure, for example a p-type doped semiconductor material may form a first layer, on which an intrinsic semiconductor material may form a second layer, and a n-type doped semiconductor may form a third layer on top of the second layer. This results in a three layer PIN junction, which has a low resistance to negative charge carriers moving in one direction, and a high resistance to negative charge carriers moving in the opposing direction when the junction is unilluminated by optical radiation to which it is photosensitive. Therefore if such a device has an electric field applied, with a positive potential applied to plate above the p-type layer, negative charge carriers in the junction will move towards the p-type layer which forms an upper surface of the junction, causing negative charge accumulation on this surface.

In some examples an alternative photodiode structure may be used, for example a PN junction, a Shottky photodiode structure or an avalanche photodiode.

The photodiode structure may for example have any of the properties described in relation to FIGS. 1-4D above.

Block 504 comprises forming a charge pattern on the surface by selectively irradiating the surface. As the surface is formed using a photodiode structure, when irradiated, the electrical properties of the photosensitive image surface change. As described above, when unilluminated by optical radiation to which it is sensitive, the resistance to current in one direction is higher than that of the opposing direction, however when illuminated with radiation the resistance to current is low in both directions. Therefore when the surface is charged, selectively irradiating the surface causes the resistance of the photodiode structure to change such that the accumulated charge at the surface may move through the photosensitive imaging surface, causing the surface to discharge. The illumination may be provided, for example, by a laser, which may be scanned across the surface to define the pattern to be discharged, for example using at least one mirror, for example a micro mirror, or the like. In some examples, the surface may be illuminated by a plurality of lasers, controlled to define the image.

The type of radiation (e.g. wavelength, intensity and the like) applied to cause this change may depend on the materials the photodiode structure is constructed from and/or may depend on its structural detail. For example a silicon PIN photodiode is sensitive to radiation with a wavelength of less than ~1100 nm, and germanium or InGaAs PIN photodiodes are sensitive to radiation of wavelength ~1500 nm.

Figure 6:
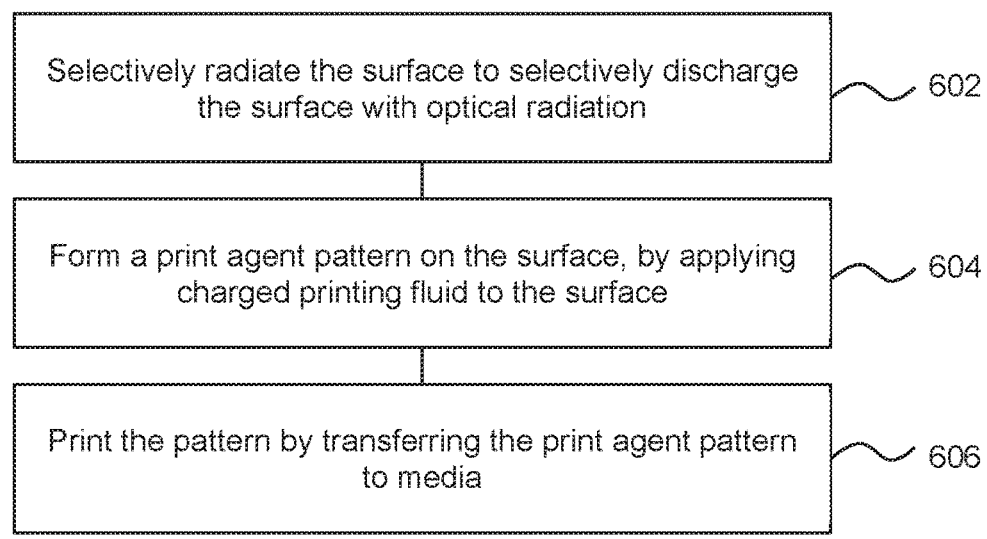
FIG. 6 is a flowchart of a further example method of operating a printing device.

FIG. 6 is an example of a method, which may comprise a method of printing an image, and which may follow the method of block 502 of FIG. 5 in some examples.

Block 602 comprises selectively radiating the surface to selectively discharge the surface with optical radiation. The surface may comprise features to improve the quality of the pattern created by the selective discharging. For example the surface may reduce lateral charge carrier movement and/or optical diffraction with barriers, such as trenches, or dopant gradients, or may comprise a layer of a material with low electron mobility. The surface may be defined into pixels, as described above. In some examples, an insulating top layer, and/or a layer selected for its refractive index, may be provided as described above. The surface may comprise any of the photodiode structures, or the features thereof, described above.

Block 604 comprises forming a print agent pattern on the surface, by applying charged printing agent to the selectively discharged surface. The print agent may be applied using a print agent source, which may present a film of print agent to the photosensitive imaging surface, as described above with reference to FIG. 3.

Block 606 comprises printing the print agent pattern, by transferring the print agent pattern to a sheet of media. In some examples the print agent pattern is transferred to an Intermediate Transfer Member, then further transferred to the sheet of media, as described above with reference to FIG. 3. In some examples, several print agent patterns are formed and transferred, for example in different colors, to build up a printed image.

An example of a method, which may be a method of manufacture of a photosensitive imaging surface comprises providing a first semiconductor layer wherein the first semiconductor layer is doped with a n-type dopant, is now described. For example, the first semiconductor layer may be deposited or grown, or an existing layer may be doped. Each layer may be formed from a single crystal (monocrystalline) or may be formed from many seeds (polycrystalline). In some examples, one seed may be used for each of a plurality of pixels, which are assembled together (for example mounted on a common back plane, which may be a conductive layer) to provide a photosensitive imaging surface.

Such an example method may further comprise providing a second semiconductor layer on top of the first semiconductor layer, wherein the second semiconductor layer is an intrinsic semiconductor. For example, the second semiconductor layer may be deposited or grown, or an existing layer may be doped.

Such an example method may further comprise providing a third semiconductor layer on top of the second semiconductor layer, wherein the third semiconductor layer is doped with a p-type dopant. For example, the third semiconductor layer may be deposited or grown, or an existing layer may be doped.

The first, second and third semiconductor layers form a photosensitive imaging device.

When considered with respect to the direction with which radiation may be applied to the photosensitive imaging surface, the second layer may be physically on top of the first layer (i.e. the second layer is closer to the radiation source than the first layer), and the third layer is physically on top of the second layer. However, the semiconductor layers may be formed during manufacture in any order. For example the first layer may be deposited, the second layer may then be deposited on top of the first layer and the third layer may then be deposited on top of the second layer. Alternatively the second layer may be provided by bulk semiconductor, and the first layer may be formed in the bulk semiconductor by doping, for example by implanting n-type dopants, in a first side of the bulk semiconductor and the third layer may be formed by doping, for example implanting p-type dopants, in a second side of the bulk semiconductor. In this way the second layer is formed, then the first layer then the third layer.

An example of a method, which may follow the method of manufacture of a photosensitive imaging surface described above, comprises providing a metal layer below the first semiconductor layer. Such a metal layer may, in use of the photosensitive imaging surface be connected to ground, to act as a grounded plate capacitor when a biased conductive plate is used to charge the photosensitive imaging surface formed in the method of manufacture of a photosensitive imaging surface.

The method may further comprise providing a silicon dioxide layer on top of the third semiconductor layer. The silicon dioxide has a refractive index similar to that of an example printing fluid, which may be surface treatment or cleaning fluid and/or a fluid such as an imaging oil or printing agent, and therefore may reduce optical defects in the generated image, as described above. In other examples, other materials may be used to form such a layer.

The method may further comprise defining pixels in a layer of the photosensitive imaging surface. Defining pixels in the layer may comprise at least one of etching trenches in at least one layer and selectively doping at least one layer. In some examples, the pixels may be defined by creating optical barriers. In other examples, the pixels may be formed from separate seeds. The pixels may, in some examples, be configured to reduce lateral movement of charge carriers in the surface when a latent electrostatic image is formed, thereby improving image quality. In some examples, the pixels may be configured to reduce an accuracy error which may otherwise occur due to diffraction.

Figure 7:
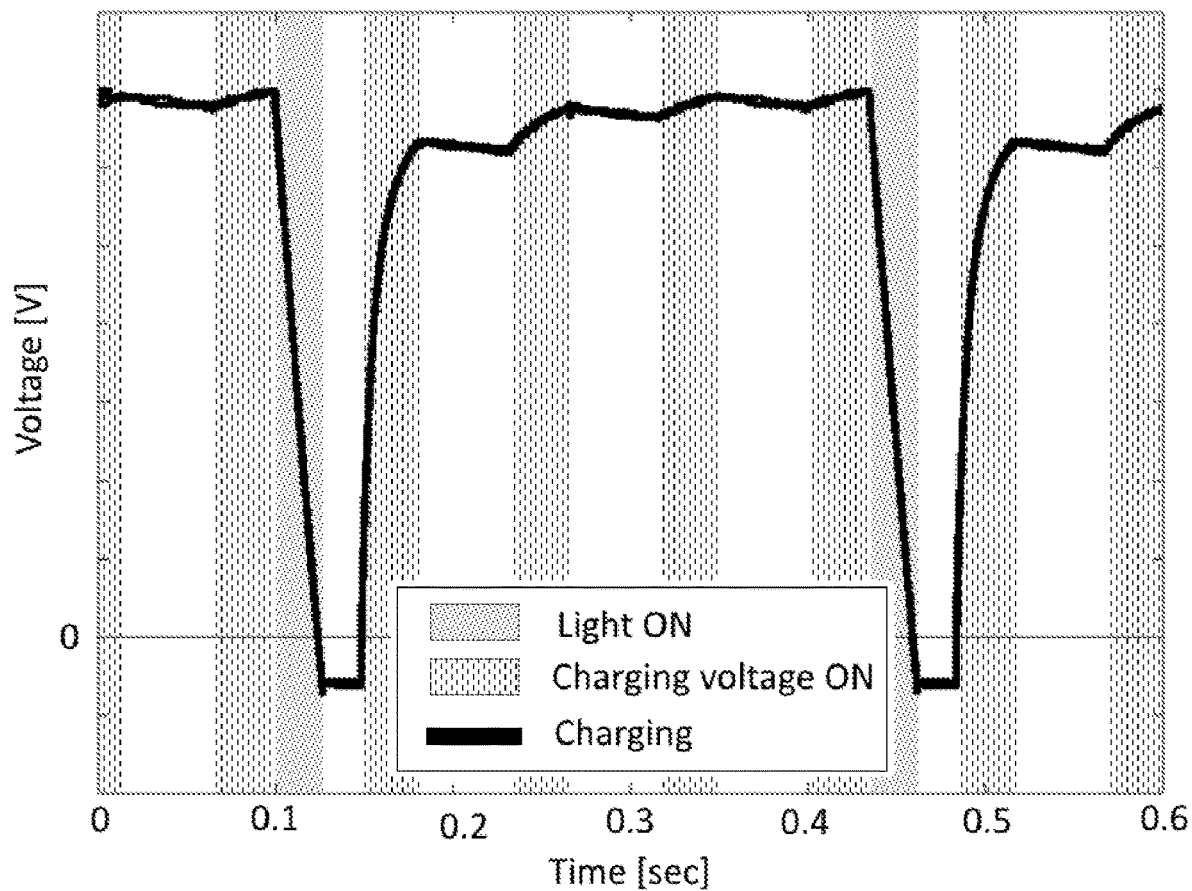
FIG. 7 is a graph showing charging of a photosensitive imaging surface.

FIG. 7 shows a graph of experimental results relating to a photosensitive imaging surface as described herein, in this example comprising a PIN structure. The graph shows voltage across an effective capacitor, arranged as shown by capacitor 216 in FIGS. 2A and 2B, as a function of time. An electric field was periodically applied to charge the surface. For one charging cycle out of four, a light was shone on the surface causing the surface to discharge. For the other three out of four cycles the surface remained in darkness (or at least in darkness from radiation to which it was sensitive) and the surface retained the charge.

In some practical examples, the voltages used may be in the range of around 300-600V, and/or may be 10-20% lower than voltages used to charge photoconductive surfaces.

The present disclosure is described with reference to flow charts and block diagrams of the method, devices and systems according to examples of the present disclosure. Although the flow diagrams described above show a specific order of execution, the order of execution may differ from that which is depicted. Blocks described in relation to one flow chart may be combined with those of another flow chart.

While the method, apparatus and related aspects have been described with reference to certain examples, various modifications, changes, omissions, and substitutions can be made without departing from the spirit of the present disclosure. It is intended, therefore, that the method, apparatus and related aspects be limited by the scope of the following claims and their equivalents. It should be noted that the above mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality.

The features of any dependent claim may be combined with the features of any of the independent claims and/or other dependent claim(s).

The invention claimed is:

1. A photosensitive imaging surface provided by an extended photodiode structure, the photosensitive imaging surface comprising a layer divided into pixels by barriers which act to block at least one of optical radiation transmission and charge transfer therethrough.

2. The photosensitive imaging surface of claim 1, wherein the extended photodiode structure comprises:
   a first layer comprising n-type doped semiconductor material;
   a second layer comprising an intrinsic semiconductor material; and
   a third layer comprising p-type doped semiconductor material.

3. The photosensitive imaging surface of claim 2, wherein the second layer is on top of the first layer, and the third layer is on top of the second layer.

4. The photosensitive imaging surface according to claim 1, wherein the extended photodiode structure is arranged on a grounded conductive layer.

5. The photosensitive imaging surface according to claim 1 wherein the extended photodiode structure is formed on at least part of a cylindrical surface.

6. The photosensitive imaging surface according to claim 1, comprising a low electron mobility layer on top of the extended photodiode structure.

7. The photosensitive imaging surface according to claim 1 wherein the photosensitive imaging surface further comprises:
   a layer with refractive index lower than a refractive index of the photodiode structure, on top of the photodiode structure.

8. The photosensitive imaging surface of claim 1, wherein the photodiode structure comprises at least one of:
   a PIN (p-type, intrinsic, n-type) junction;
   a PN (p-type, n-type) junction;
   a Shottky photodiode structure; and
   an avalanche photodiode.

9. A method comprising:
   charging a surface of a photosensitive imaging device with charges originating within a photodiode structure on which the surface is formed, by applying an electric field to the photosensitive imaging device; and forming a charge pattern on the surface by selectively irradiating the surface.

10. The method of claim 9, wherein forming a charge pattern comprises:
selectively radiating the surface to selectively discharge the surface with optical radiation.

11. The method of claim 10, further comprising:
forming a print agent pattern on the surface, by applying charged printing agent to the selectively discharged surface; and
printing the print agent pattern, by transferring the print agent pattern to print media.

12. A printing apparatus comprising:
a photosensitive imaging surface provided by an extended photodiode structure;
a charging element to apply an electric field to cause movement of charge towards a face of the photosensitive imaging surface; and
a write head, to selectively discharge a portion of the photosensitive imaging surface.

13. The printing apparatus of claim 12, wherein the charging element is a non-ionizing charging element.

14. The printing apparatus of claim 12, comprising a grounded metal layer, wherein the extended photodiode structure is provided between the charging element and the grounded metal layer to form a grounded plate capacitor.

* * * * *